United States Patent
Kudaravalli

(10) Patent No.: US 6,923,009 B2
(45) Date of Patent: Aug. 2, 2005

(54) PRE-COOLER FOR REDUCING CRYOGEN CONSUMPTION

(75) Inventor: Ravikumar Kudaravalli, Florence, SC (US)

(73) Assignee: GE Medical Systems Global Technology, LLC, Waukesha, WI (US)

( * ) Notice: Subject to any disclaimer, the term of this patent is extended or adjusted under 35 U.S.C. 154(b) by 0 days.

(21) Appl. No.: 10/604,242

(22) Filed: Jul. 3, 2003

(65) Prior Publication Data

US 2005/0016187 A1 Jan. 27, 2005

(51) Int. Cl.[7] .......................... F25B 19/00; F25B 25/00; F25D 23/12
(52) U.S. Cl. .......................... 62/51.1; 62/259.2; 62/332
(58) Field of Search .......................... 62/51.1, 259.2, 62/63, 332, 374

(56) References Cited

U.S. PATENT DOCUMENTS

| | | | |
|---|---|---|---|
| 4,080,802 A | * 3/1978 | Annable | ................... 62/51.2 |
| 4,796,433 A | * 1/1989 | Bartlett | ................... 62/47.1 |
| 5,247,800 A | 9/1993 | Mruzek | |
| 5,258,710 A | 11/1993 | Black | |
| 5,278,502 A | 1/1994 | Laskaris | |
| 5,317,296 A | 5/1994 | Vermilyea | |
| 5,317,879 A | 6/1994 | Goldberg | |
| 5,333,464 A | 8/1994 | Laskaris | |
| 5,394,130 A | 2/1995 | Xu | |
| 5,410,286 A | 4/1995 | Herd | |
| 5,430,423 A | 7/1995 | Herd | |
| 5,442,928 A | 8/1995 | Laskaris | |
| 5,485,730 A | 1/1996 | Herd | |
| 5,513,498 A | 5/1996 | Ackermann | |
| 5,522,226 A | 6/1996 | Mruzek | |
| 5,563,566 A | 10/1996 | Laskaris | |
| 5,613,367 A | 3/1997 | Chen | |
| 5,657,634 A | 8/1997 | Woods | |
| 5,701,742 A | 12/1997 | Eckels | |
| 5,774,032 A | 6/1998 | Herd | |
| 5,864,273 A | 1/1999 | Dean | |
| 5,936,499 A | 8/1999 | Eckels | |
| 5,960,636 A | * 10/1999 | Schuck et al. | .................. 62/63 |
| 6,038,867 A | 3/2000 | Einziger | |
| 6,076,372 A | * 6/2000 | Acharya et al. | .............. 62/606 |
| 6,078,234 A | 6/2000 | Huang | |
| 6,100,780 A | 8/2000 | Dorri | |
| 6,181,228 B1 | 1/2001 | Laskaris | |
| 6,246,308 B1 | 6/2001 | Laskaris et al. | |
| 6,289,681 B1 | 9/2001 | Eckels | |
| 6,415,613 B1 | 7/2002 | Ackermann | |
| 6,463,744 B1 | * 10/2002 | Alexeev et al. | ................... 62/6 |
| 6,484,516 B1 | * 11/2002 | Agrawal et al. | ................ 62/86 |
| 6,516,282 B2 | 2/2003 | Hedlund | |
| 6,560,969 B1 | 5/2003 | Eckels | |
| 6,595,006 B2 | * 7/2003 | Thiesen et al. | ................... 62/6 |

* cited by examiner

*Primary Examiner*—William C. Doerrier
(74) *Attorney, Agent, or Firm*—Michael DellaPenna

(57) ABSTRACT

MRI system 10 is provided. The MRI system 10 includes a magnet assembly 12. A first cryogen cooling fluid 20 is utilized to cool the magnet assembly 12. A first supply line 16 communicates the first cryogen cooling fluid 20 to the magnet assembly 12. A first return line 18 communicates the first cryogen cooling fluid 20 away from the magnet assembly 12. A blower assembly 22 is positioned between and in communication with the first supply line 16 and the first return line 18. A regenerative heat exchanger 36 is in communication with the first supply line 16 and the first return line 18. The regenerative heat exchanger 36 transfers thermal energy 29 from the first supply line 16 to the first return line 18. The regenerative heat exchanger 36 is positioned between the blower assembly 22 and the magnet assembly 12. A second supply line 28 transports a second cryogen fluid 26 through a pre-cooler assembly 24. The pre-cooler assembly 24 is positioned between the regenerative heat exchanger 36 and the magnet assembly 12. The pre-cooler assembly 24 transfers thermal energy 29 from the first supply line 16 to the second supply line 28.

10 Claims, 1 Drawing Sheet

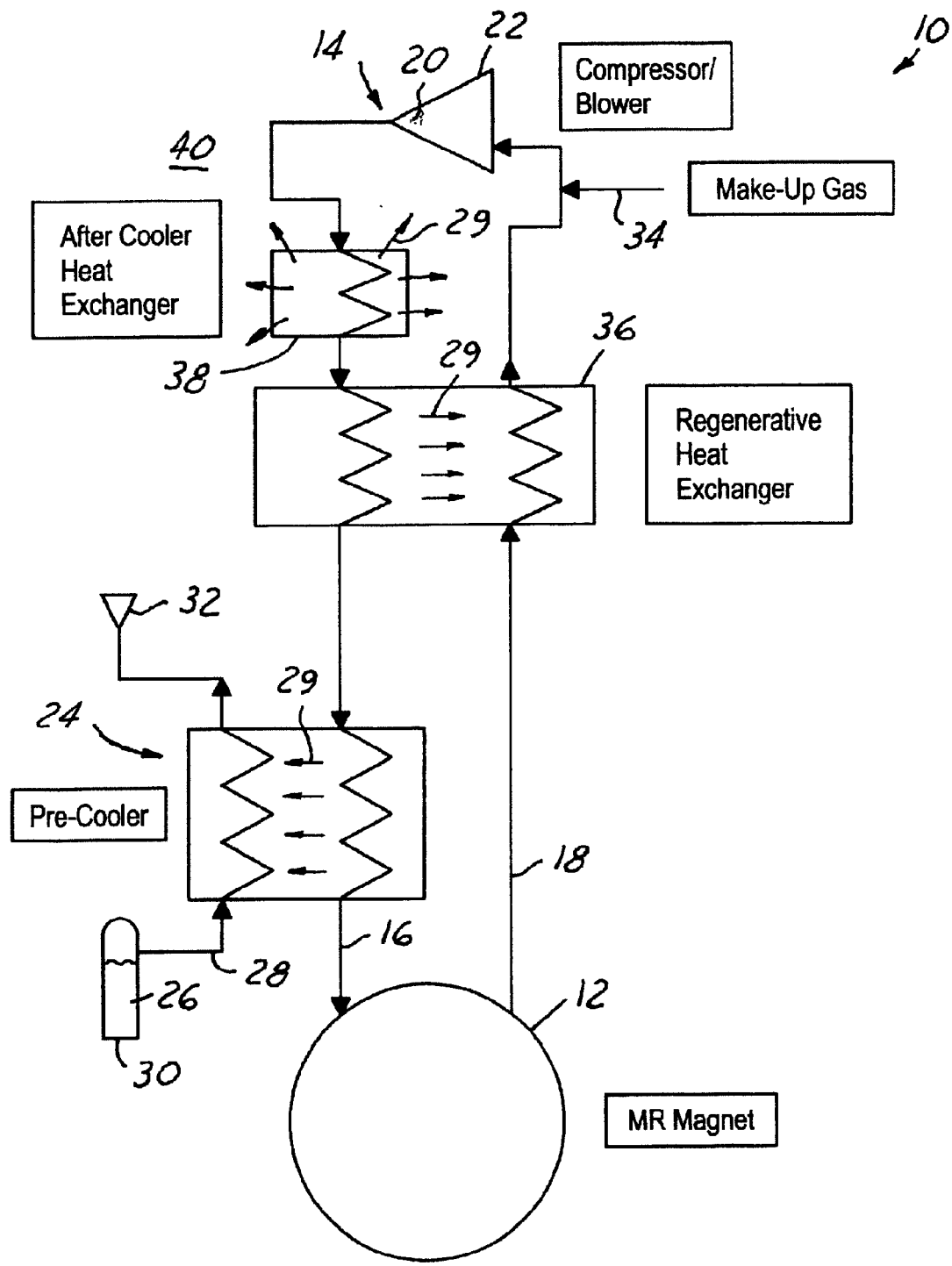

PRE-COOLER FOR REDUCING CRYOGEN CONSUMPTION

BACKGROUND OF INVENTION

The present invention relates generally to Magnetic Resonance Imaging (MRI) systems, and more particularly, to a method and system for reducing cryogen consumption in MRI systems.

Magnetic Resonance Imaging (MRI) is a well-known medical procedure for obtaining detailed, one, two and three-dimensional images of patients, using the methodology of nuclear magnetic resonance (NMR). MRI is well suited to the visualization of soft tissues and is primarily used for diagnosing disease pathologies and internal injuries.

Typical MRI systems include a super conducting magnet capable of producing a strong, homogenous magnetic field around a patient or portion of the patient; a radio frequency (RF) transmitter and receiver system, including transmitter and receiver coils, also surrounding or impinging upon a portion of the patient; a gradient coil system also surrounding a portion of the patient; and a computer processing/imaging system, receiving the signals from the receiver coil and processing the signals into interpretable data, such as visual images.

The super conducting magnet is used in conjunction with a gradient coil assembly, which is temporally pulsed to generate a sequence of controlled gradients in the main magnetic field during a MRI data gathering sequence. Inasmuch as the main superconducting magnet produces a homogeneous field, no spatial property varies from location to location within the space bathed by such field; therefore, no spatial information, particularly pertaining to an image, can be extracted therefrom, save by the introduction of ancillary means for causing spatial (and temporal) variations in the field strength. This function is fulfilled by the above-mentioned gradient coil assembly; and it is by this means of manipulating the gradient fields that spatial information is typically encoded.

Super conducting magnets operate under extremely low temperatures. This is commonly accomplished through the use of cryogens such as liquid helium. The cryogens must often be stored and delivered under low temperatures in order to deliver the proper efficiency. Cryogens such as liquid helium, however, are not abundant and therefore can significantly impact the cost of operation of the MRI system. In addition exposure of liquid helium to room temperature magnets can result in the boiling of the liquid helium which negatively impacts the performance and efficiency of the MRI system.

It is known that the economics and efficiency of cryogen based MRI systems can be improved by cooling the MR magnet components from room temperature to an intermediate temperature closer to the final liquid helium operational temperatures. Pre-cooling the MR magnet components is preferably accomplished through low cost and easily available cryogen materials. Existing pre-cooling designs operate under thermodynamic inefficiencies that consume more refrigerant/cryogen. This emphasizes the cost components of liquid helium systems. Additionally, the inefficiencies can result in the generation of undesired condensate/icing. This can result in the freezing and seizing of the blower bearings. The blowers and bearings may be redesigned in order to minimize the impact of bearing freeze. This, however, requires the use of special blowers that increases both the initial cost of the MRI system as well as the cost of maintenance and replacement blowers.

It would, therefore, be highly desirable to have a MRI cooling assembly with improved cooling efficiency and a reduction of cryogen consumption. It would additionally be highly desirable to have a MRI cooling assembly that could be implemented without the necessity of costly specialized blower assemblies.

SUMMARY OF INVENTION

In accordance with one aspect of the present invention, a MRI system is provided. The MRI system includes a magnet assembly. A first cryogen cooling fluid is utilized to cool the magnet assembly. A first supply line communicates the first cryogen cooling fluid to the magnet assembly. A first return line communicates the first cryogen cooling fluid away from said magnet assembly. A blower assembly is positioned between and in communication with the first supply line and the first return line. A regenerative heat exchanger is in communication with the first supply line and the first return line. The regenerative heat exchanger transfers thermal energy from the first supply line to the first return line. The regenerative heat exchanger is positioned between the blower assembly and the magnet assembly. A second supply line transports a second cryogen fluid through a pre-cooler assembly. The pre-cooler assembly is positioned between the regenerative heat exchanger and the magnet assembly. The pre-cooler assembly transfers thermal energy from the first supply line to the second supply line.

The present invention itself, together with attendant advantages, will be best understood by reference to the following detailed description, taken in conjunction with the accompanying FIGURES.

BRIEF DESCRIPTION OF DRAWINGS

For a more complete understanding of this invention reference should now be had to the embodiments illustrated in greater detail in the accompanying FIGURES and described below by way of examples of the invention wherein:

FIG. 1 is a schematic diagram of a MRI system in accordance with one embodiment of the present invention.

DETAILED DESCRIPTION

Referring now to FIG. 1, which is a schematic diagram of a MRI system 10 in accordance with the present invention. It is contemplated that the present invention can be implemented into a wide variety of magnetic resonance imaging designs and should not be limited to those particular described embodiments. It is contemplated that the MRI system 10 includes a magnet assembly 12. The use of magnet assemblies 12 is well known within the medical imaging field. Although a variety of magnet assemblies 12 are contemplated, one embodiment contemplates the use of a super-conducting magnet assembly 12.

The magnet assembly 12 requires the maintenance of a particular temperature range for optimal performance. To this end, the present invention further includes a MRI cooling assembly 14. The MRI cooling assembly includes a first supply line 16 and a first return line 18 in communication with the magnet assembly 12. The first supply line 16 and first return line 18 transport a first cryogen cooling fluid 20 to and from the magnet assembly 12. It should be understood that the first supply line 16 and first return line 18 may be formed in a variety of configurations suitable for this purpose. Similarly, although a variety of first cryogen cooling fluids 20 are contemplated, one embodiment utilizes a helium fluid/gas for the first cryogen cooling fluid 20.

A blower/compressor assembly 22 is positioned between the first supply line 16 and the first return line 18 opposite the magnet assembly 12. The blower assembly 22 is responsible for movement of the first cryogen cooling fluid 20 throughout the MRI cooling assembly 14. By way of compressing and moving the helium/first cryogen 20 through the MRI cooling assembly 14, the temperature of the magnet assembly 12 can be lowered during pre-cooling operation. It is known, however, that the thermal efficiencies of such a system operating alone can impact the MRI cooling assembly 14 design. The present invention, therefore, further includes a pre-cooler assembly 24.

The pre-cooler assembly 24 is in thermal communication with the first cryogen cooling fluid 20 through the first supply line 16. The pre-cooler assembly 24 is preferably positioned immediately adjacent the magnet assembly 12. The term immediately adjacent is intended to be defined as closer in flow proximity to the magnet assembly 12 than the subsequently described heat exchangers. The pre-cooler assembly 24 can be configured in a variety of fashions. One embodiment contemplates the use of a second cryogen fluid 26 flowing through a second supply line 28. The pre-cooler assembly 24 places the second supply line 28 in thermal communication with the first supply line 16 such that thermal energy 29 is drawn from the first supply line 16 into the second supply line 28. This reduces the temperature of the first cryogen 20 prior to entering the magnet assembly 12. This, in turn, improves the efficiency of the MRI cooling assembly 14.

Although the second cryogen fluid 26 can be provided in a variety of fashions, one embodiment contemplates the use of a source of compressed cryogen 30 in communication with the second supply line 28. The compressed second cryogen 26 can be controllably released into the second supply line 28 to control pre-cooling of the first cryogen 20. In this embodiment, a vent 32 may be placed in communication with the second supply line 28 in a position opposing the source of compressed cryogen 30. The vent 32 is utilized to allow the second cryogen 26 to be vented into the atmosphere. Depending on the size of the operational environment, it may be desirable to position the vent 32 such that the second cryogen 26 is vented into outside atmosphere. Although the second cryogen 26 may be comprised of a variety of materials, one embodiment contemplates the use of liquid nitrogen. This allows for a relatively inexpensive refrigerant to be utilized while protecting a more expensive cryogen within the comparatively closed-loop system of the first cryogen 20 flow path. It should be understood that although the first cryogen 20 flow may be considered closed-loop, losses of the first cryogen 20 are contemplated during normal operation. To this end, the present invention may further include a make-up gas supply 34 in communication with the first return line 18 in order to replace any losses of first cryogen 20.

A concern arising from the use of the pre-cooler assembly 24 arises from the low temperatures of the first cryogen 20 returning from the magnet assembly 12 to the blower assembly 22. The present invention addresses this issue by including a regenerative heat exchanger 36 in communication with both the first supply line 16 and the first return line 18. The regenerative heat exchanger 36 is positioned between the magnet assembly 12 and the blower assembly 22. The regenerative heat exchanger 36 places the first supply line 16 in thermal communication with the first return line 18 such that thermal energy 29 may be transferred from the first supply line 16 into the first return line 18. In this fashion, thermal energy 29 contained in the supply line 16 may be utilized to raise the temperature of the first cryogen 20 entering the blower assembly 22. This prevents the first cryogen 20 from freezing or seizing the blower assembly 22 bearings. It is preferable that the first cryogen 20 flowing through the first return line 18 exits the regenerative heat exchanger 36 at or near room temperature. This allows for the use of low-cost and commonplace room-temperature blower assemblies 22 to be utilized. The term "room-temperature blower assemblies" is known to encompass a range of blower assemblies designed for operation between the temperatures of 5–50 degrees Celsius. It should be understood that this range is only illustrative in nature. These blower assemblies 22 allow for a reduced cost MRI cooling assembly 14 with improved efficiency. The efficiency provided allows for the use of premium refrigerants.

The present invention further improved efficiency by including an after-cooler heat exchanger 38. The after-cooler heat exchanger 38 is in thermal communication with the first supply line 16 and transfers thermal energy 29 from the first cryogen 20 to room temperature ambient 40. It should be understood that ambient room temperature will be dependent on the location of the MRI assembly 10 and associated room conditions. The after-cooler heat exchanger 38 is preferably positioned between the regenerative heat exchanger 36 and the blower assembly 22. This rejects the heat of compression in to ambient room temperature rather than into the refrigeration media. This reduces consumption of the second cryogen 26 and increases the thermodynamic efficiency of the process. This, in turn, minimizes entropy production and can reduce refrigerant costs.

Although numerous heat exchangers have been referenced in the above application, it should be understood that the present invention contemplates the use of any present or future methodologies for transfer of thermal energy that will function as described and claimed. Furthermore, it is contemplated that the regenerative heat exchanger 36 and the pre-cooler assembly 24 may be protected from ambient room conditions such as temperature and moisture by standard cryogenic industry practices.

The above-described apparatus, to one skilled in the art, is capable of being adapted for various purposes and is not limited to the following systems: MRI systems, magnetic resonance spectroscopy systems, and other applications where pre-cooling is helpful either functionally and/or economically. The above-described invention may also be varied without deviating from the spirit and scope of the invention as contemplated by the following claims.

What is claimed is:

1. A MRI system comprising:
   a magnet assembly;
   a first cryogen cooling fluid;
   a first supply line in communication with said magnet assembly, said first supply line transporting said first cryogen cooling fluid to said magnet assembly;
   a first return line in communication with said magnet assembly, said first return line transporting said first cryogen cooling fluid away from said magnet assembly;
   a blower assembly positioned between and in communication with said first supply line and said first return line;
   a regenerative heat exchanger in communication with said first supply line and said first return line, said regenerative heat exchanger transferring thermal energy from said first supply line to said first return line, said regenerative heat exchanger positioned between said blower assembly and said magnet assembly;

a second supply line transporting a second cryogen fluid;

a pre-cooler assembly positioned between said regenerative heat exchanger and said magnet assembly, said pre-cooler assembly in communication with said first supply line and said second supply line, said pre-cooler assembly transferring thermal energy from said first supply line to said second supply line; and an after-cooler heat exchanger in communication with said first supply line, said after-cooler heat exchanger transferring thermal energy away from said first supply line;

wherein said after-cooler heat exchanger transfers thermal energy from said first supply line into room temperature ambient.

2. A MRI cooling assembly for use with an MRI magnet assembly comprising:

a first cryogen cooling fluid;

a first supply line in communication with the magnet assembly, said first supply line transporting said first cryogen cooling fluid to the magnet assembly;

a first return line in communication with the magnet assembly, said first return line transporting said first cryogen cooling fluid away from the magnet assembly;

a blower assembly positioned between and in communication with said first supply line and said first return line;

an after-cooler heat exchanger positioned between said blower assembly and the magnet assembly, said after-cooler heat exchanger in communication with said first supply line, said after-cooler heat exchanger transferring thermal energy from said first supply line to room temperature ambient;

a second supply line transporting a second cryogen fluid; and a pre-cooler assembly positioned between said regenerative heat exchanger and the magnet assembly, said pre-cooler assembly in communication with said first supply line and said second supply line, said pre-cooler assembly transferring thermal energy from said first supply line to said second supply line.

3. A MRI cooling assembly as in claim 2, further comprising:

a regenerative hear exchanger in communication with said first supply line and said first return line, said regenerative heat exchanger transferring thermal energy from said first supply line to said first return line, said regenerative heat exchanger positioned between said blower assembly and the magnet assembly.

4. A MRI cooling assembly as in claim 3, further comprising:

a make-up gas supply in communication with said first return line, said make-up gas supply positioned between said regenerative heat exchanger and said blower assembly.

5. A MRI cooling assembly as in claim 2, wherein said first cryogen comprises helium and said second cryogen comprises nitrogen.

6. A MRI cooling assembly as in claim 2, wherein:

said pre-cooler assembly comprises:

a source of compressed nitrogen supplying said second supply line; and a vent in communication with said second supply line, said vent releasing said second cryogen fluid from said second supply line.

7. A MRI cooling assembly as in claim 3, wherein said regenerative heat exchanger is configured such that said first cryogen cooling fluid traveling through said first return line exits said regenerative heat exchanger at substantially room temperature.

8. A MRI cooling assembly as in claim 2 MRI system as in claim 2 wherein said after-cooler heat exchanger transfers thermal energy from said first supply line into room temperature ambient.

9. A method of cooling an MRI magnet comprising:

circulating a first cryogen through the MRI magnet using a blower assembly, said blower assembly supplying said first cryogen to the MRI magnet using a first supply line, said blower receiving said first cryogen from the MRI magnet using said first return line;

transferring thermal energy from said first supply line to said first return line prior to said first return line entering said blower assembly;

pre-cooling said first cryogen within said first supply line immediately prior to said first cryogen entering the MRI magnet, said pre-cooling utilizing a second cryogen in thermal communication with said first supply line; and transferring thermal energy from said first supply line to room temperature ambient.

10. A method of cooling an MRI magnet comprising:

circulating a first cryogen through the MRI magnet using a blower assembly, said blower assembly supplying said first cryogen to the MRI magnet using a first supply line, said blower receiving said first cryogen from the MRI magnet using said first return line;

transferring thermal energy from said first supply line to said first return line prior to said first return line entering said blower assembly; and pre-cooling said first cryogen within said first supply line immediately prior to said first cryogen entering the MRI magnet, said pre-cooling utilizing a second cryogen in thermal communication with said first supply line;

wherein said transfer of thermal energy from said first supply line to room temperature is performed prior to said transfer of thermal energy from said first supply line to said first return line.

* * * * *